United States Patent [19]

Nishida et al.

[11] Patent Number: 5,060,070

[45] Date of Patent: Oct. 22, 1991

[54] SOLID STATE IMAGE SENSOR HAVING LOW AND HIGH LEVEL SIGNAL COMPONENT DETECTORS

[75] Inventors: Yasuaki Nishida, Tokyo; Yoshiyuki Matsunaga, Kamakura; Nozomu Harada, Yokohama; Sohei Manabe, Yokohama; Yukio Endo, Yokohama, all of Japan

[73] Assignees: Nippon Hoso Kyokai, Tokyo; Kabushiki Kaisha Toshiba, Kawasaki, both of Japan

[21] Appl. No.: 527,444

[22] Filed: May 23, 1990

[30] Foreign Application Priority Data

May 25, 1989 [JP] Japan .................................. 1-131869

[51] Int. Cl.⁵ ............................................... H04N 3/14
[52] U.S. Cl. ........................... 358/213.1 S; 358/213.16
[58] Field of Search .................... 358/213.1 S, 213.18, 358/213.16, 213.19, 909

[56] References Cited

U.S. PATENT DOCUMENTS

| | | | |
|---|---|---|---|
| 4,495,523 | 1/1985 | Ozawa | 358/213.1 S |
| 4,574,309 | 3/1986 | Arisawa et al. | 358/213.19 |
| 4,589,024 | 5/1986 | Koch | 358/213.19 |
| 4,839,729 | 6/1989 | Ando et al. | 358/213.16 |
| 4,902,886 | 2/1990 | Smisko | 358/213.1 S |
| 4,974,093 | 11/1990 | Murayama et al. | 358/213.1 S |

OTHER PUBLICATIONS

"A High Sensitivity Output Amplifier for CCD Image Sensor" Y. Matsunaga et al., pp. 116-119.

*Primary Examiner*—Stephen Brinich
*Attorney, Agent, or Firm*—Oblon, Spivak, McClelland, Maier & Neustadt

[57] ABSTRACT

A solid state image sensor comprises a CCD type image sensing device and a signal detector. This signal detector comprises an FDA type signal detection circuit connected to a signal pick-up terminal of the image sensing device and having a small amount of saturating signals and low noise, an FDA type signal detection circuit connected to the signal pick-up terminal and having a large amount of saturating signals and high noise, and a signal composing circuit for composing the outputs of both signal detection circuits and outputting a composed output and changing a composing ratio in accordance with the output of the FDA type signal detection circuit.

9 Claims, 3 Drawing Sheets

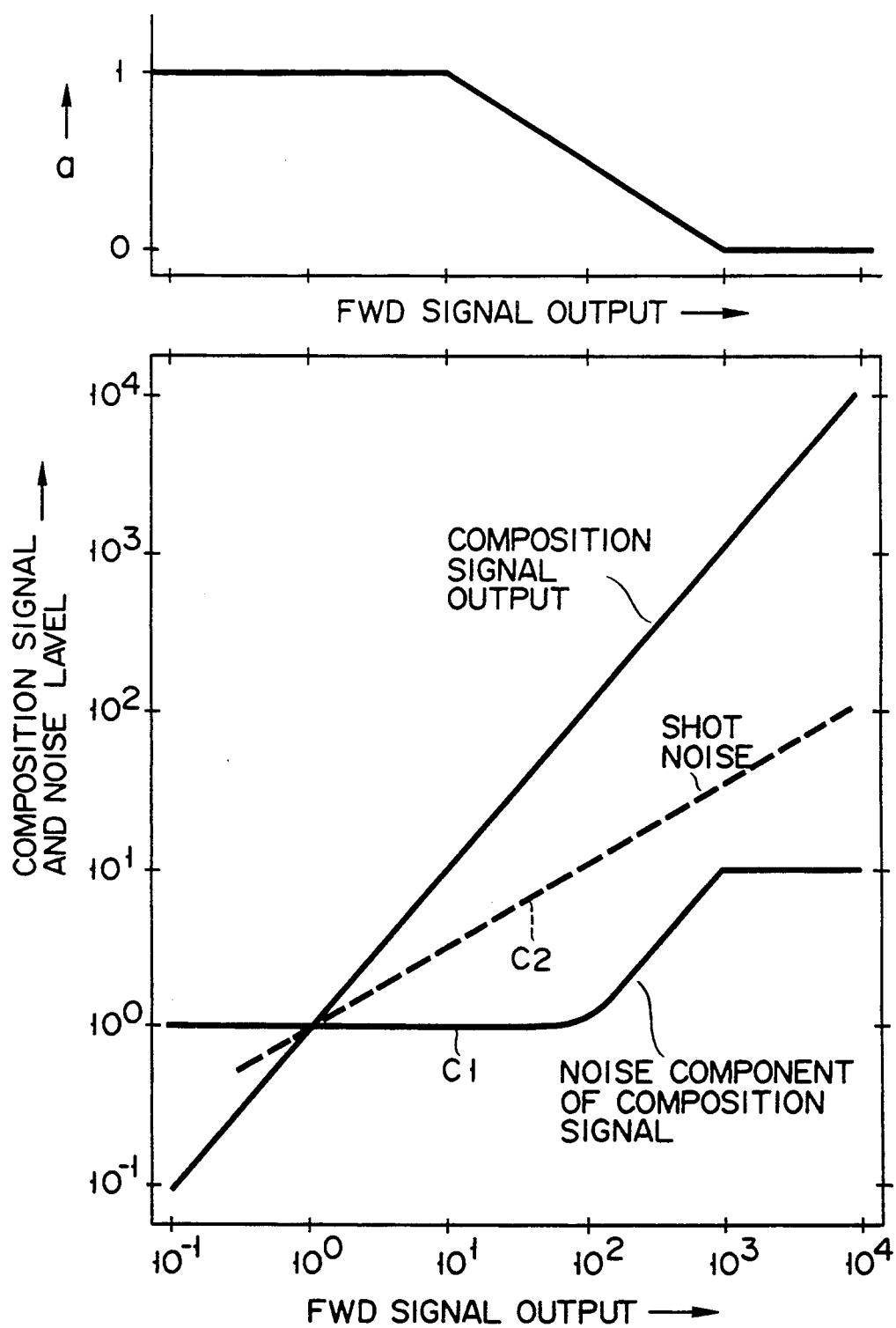
F I G. 4

SOLID STATE IMAGE SENSOR HAVING LOW AND HIGH LEVEL SIGNAL COMPONENT DETECTORS

BACKGROUND OF THE INVENTION

1. Field of the Invention

The present invention relates to a solid state image sensor using a CCD, and, more particularly, to a solid state image sensor with an improved signal detector which finally extracts signal charges from a CCD type image sensing channel.

2. Description or the Related Art

Conventionally, a solid state image sensor employs a signal detector using a floating diffusion type amplifier (FDA) or a floating well type detector (FWD) in order to detect signal charges from a CCD type image sensing channel In the FDA, a source follower type amplifier of an E/D type is connected to a signal pick-up terminal from a image sensing channel. In the FWD, transistors are formed in a direction perpendicular to the CCD charge transfer direction (Draft 2-12, Television Society National Convention in 1988). This FWD prevents noise generation by an interfacial trap because a current flowing through a p type channel, i.e., a hole current, is modulated by signal charges (electrons) transferred through an n type buried channel so as not to flow through an Si-SiO$_2$ interface. Also, making a gate oxidized film 1 $\mu$m thick can reduce the amount of a detected capacitance and provide a high sensitivity. A floating potential plate for making the potential of a channel remote from a gate electrode uniform is provided, and further, a load transistor and an E/D source follower type amplifier are provided.

However, such amplifier have been the following problems. Regarding the FDA, the amount of saturating signals is large enough, but there is relatively large noise, which corresponds to 20 to 40 electrons in terms of the number of electrons packet (refer to Television Society Magazine Vol. 39, No. 12 (1985), pp. 1176-1181). In the FWD, on the other hand, the amount of saturating signals is as small as approximately 2000 electrons although the number of noise electrons is less than one electron.

Therefore, conventionally, there has been a tradeoff relation such that a signal detector with less noise has a smaller amount of saturating signals and a signal detector with a large amount of saturating signals generates greater noise.

SUMMARY OF THE INVENTION

Accordingly, it is an object of the present invention to provide a solid state image sensor with a high sensitivity and low noise, which can detect signal charges with low noise and sufficiently increase the amount of saturating signals.

The present invention can realize a signal detector with low noise and a large amount of saturating signals by employing two signal detection circuits having different noise characteristics and different amounts of saturating signals and composition signals from those two signal detection circuits.

According to this invention, there is provided a solid state image sensor comprising a CCD type image sensing channel and a signal detector, which includes a first signal detection circuit connected to a signal pick-up terminal of the image sensing channel and having a small amount of saturating signals and low noise, a second signal detection circuit connected to the signal pick-up terminal and having a large amount of saturating signals and high noise, and a signal composing circuit for composing the outputs of the first and second signal detection circuits and outputting a composed output and changing a composing ratio in accordance with the output of the first signal detection circuit.

According to this invention, mainly an output signal from the first signal detection circuit is extracted if an image signal from the image sensing channel is small, and mainly an output signal from the second signal detection circuit is extracted in case of a large image signal. In other words, a signal charge can be detected with low noise when the image signal from the image sensing channel is small, and a signal charge can be detected with a large amount of saturating signals when the image signal is large. Therefore, it is possible to detect a signal charge with high sensitivity and low noise, which shows the combined merits of two signal detection circuits.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a chart illustrating a noise characteristic of the signal detector shown in FIG. 2; and FIG. 5 is a schematic diagram illustrating the structure of a signal detector of another embodiment of the present invention.

DETAILED DESCRIPTION OF THE PREFERRED EMBODIMENTS

Figure 1:
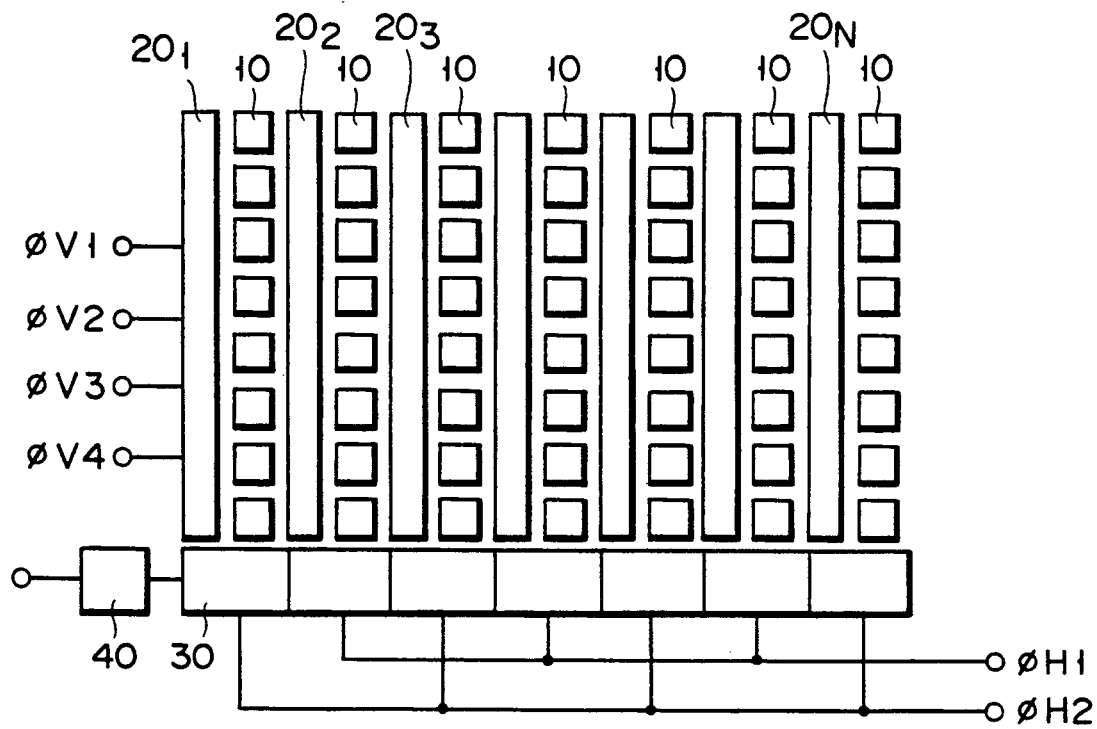
FIG. 1 is schematic plan view of a solid state image sensor with a signal charge detector according to one embodiment of the present invention.

In a solid state image sensor shown in FIG. 1, a number of pixels 10 for accumulating signal charges corresponding to an image are arranged horizontally and vertically. Vertical CCD registers $20_1$ to $20_N$ are placed adjacent to the vertical array of the pixels. The vertical CCD resistors $20_1$ to $20_N$ transfer signal charges, sent from the pixels 10, in the vertical direction. The vertical CCD registers $20_1$ to $20_N$ have output terminals close to a horizontal CCD register 30, which receives the vertically-transferred signal charges. The horizontal CCD register 30 transfers the signal charges from the vertical CCD registers $20_1$ to $20_N$ in the horizontal direction. A signal detector 40, connected to the horizontal register 30, detects the signal charges therefrom, and outputs them as an image signal.

Figure 2:
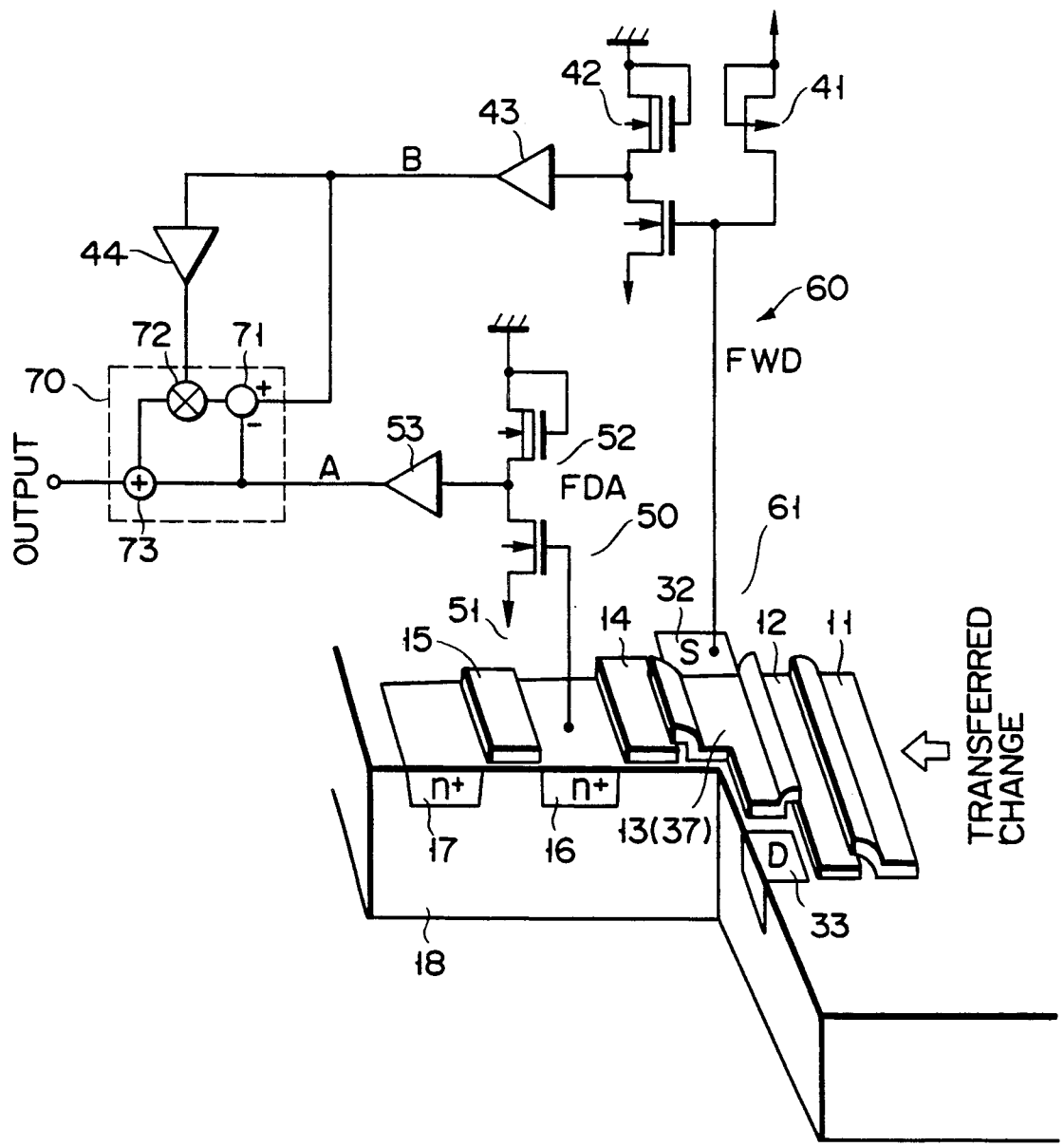
FIG. 2 is a schematic diagram illustrating the structure of the signal detector in FIG. 1.

The signal detector 40 will now be described referring to FIG. 2.

In order to realize two systems, the FWD system and FDA system, the signal detector 40 includes an FDA type signal detection circuit having a floating diffusion type amplifier 50, and an FWD type signal detection circuit having a floating well type amplifier 60, and a composing circuit 70 which composes the outputs of the amplifiers 50 and 60. As the FWD type signal detection circuit 60 can be located in a midway of a charge transfer path, it is provided at the front stage of the FDA type detection circuit 50 between transfer channels of electric charges.

Figure 3:
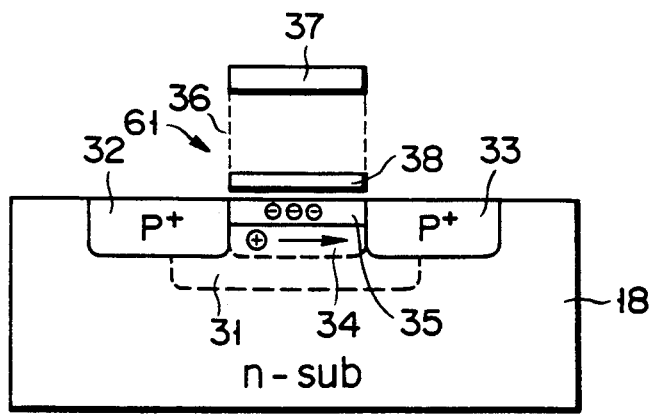
FIG. 3 is a cross section illustrating a floating well type transistor.

More specifically, as shown in FIG. 3, a p type channel 34 for constituting the FWD amplifier 60 is formed under a transfer electrode and directly below an n type buried channel 35. A source 32 and a drain 33 are formed on the respective sides of the channel 34. A gate electrode 37 for a transistor 61 of the FWD amplifier 60 is formed on the channel 35 through a thick gate oxidized film (1 μm) 36. The gate electrode 37 also serves as the transfer electrode 13. A floating potential plate 38 is provided for making uniform the potential of the channel 35 remote from the gate electrode 37.

In the transistor 61, signal charges from the horizontal (CCD) register 30 are transferred in the n type buried channel 35 of a p type well area 31 in a direction perpendicular to the surface of the drawing sheet. A current flowing through the p type channel 34 is modulated by these signal charges (electrons) transferred in the n type buried channel 35.

The gate electrode 37 is connected to input terminals of a load transistor 41 and a source follower amplifier 42. The amplifier 42 has an output terminal connected to one of input terminals of the composing circuit 70 through a buffer amplifier 43, and to another input terminal of the circuit 70 via the buffer amplifier 43 and another buffer amplifier 44. Buffer amplifier 44 generates a composing ratio signal mentioned later.

In the FDA system, an n+ region (a source) 16 and an n+ region (a reset drain) 17 are formed in a substrate 18, and a reset gate 15 is located between the both regions on the substrate 18. The n+ region 16 is connected to an E/D source follower type amplifier 52 to organize the FDA type detection circuit 50. The amplifier 52 has its output terminal connected to the other output terminal of the composing circuit 70 through a buffer amplifier 53.

The composing circuit 70 comprises, for example, a subtracter 71 is connected to output terminals of the amplifiers 53 and 43, and the multiplier 72 is connected to the output terminal of the subtracter 71 and the output terminal of the amplifier 44. The adder 73 is connected to the output terminal of the multiplier 72 and the output terminal of the amplifier 53. The adder 73 has its output terminal connected to the output terminal of the composing circuit 70.

In a solid state image sensor with the thus constituted signal detection circuit 40, when accumulated charges in the pixels 10 are sent to the vertical registers $20_1$ to $20_N$, the registers transfer the signal charges in the vertical direction in response to transfer pulses $\phi V1$ to $\phi V4$. The horizontal register 30 then transfers the received signal charges in the horizontal direction to the signal detection circuit 40 in response to transfer pulses $\phi H1$ and $\phi H2$.

In the signal detection circuit 40, the signal charges from the horizontal register 30 are transferred through the channel 35 of the transistor 61 of the FWD type detection circuit 60 to the transistor 51 of the FDA type detection circuit 50. The signal charges (i.e., image signals) from the source 32 of the transistor 61 in the FWD type detection circuit 60 are supplied to the amplifier 42 and amplified thereby. The signal charges (or image signals) from the source 16 of the transistor 51 in the FDA type signal detection circuit 50 are supplied to, and amplified by, the amplifier 52.

The output signal from the amplifier 42 is supplied to one input terminal of the composing circuit 70 via the buffers 43 and 44, and also to another input terminal of this circuit through the buffer 43. The output signal from the amplifier 52 is sent to the other input terminal of the composing circuit 70 through the buffer 53. The subtracter 71 in the composing circuit 70 subtracts the output signal (A) of the buffer 53 from the output signal (B) of the buffer 43, and outputs a difference signal. The difference signal is multiplied by the output signal of the buffer 44 in the multiplier 72. Then, the output signal from the multiplier 72 and the output signal of the buffer 53 are added together by the adder 73, and the result is output therefrom as a composition signal. That is, in accordance with the output from the FDA signal detection circuit 50, the composing circuit 70 alters the composing ratio of the output of the FDA type signal detection circuit 50 to the output of the FWD type signal detection circuit 60, and composes both of the output signals in accordance with the altered composing ratio.

The aforementioned structure can simultaneously provide two types of signals; one is an FWD output signal with low noise but a smaller amount of saturating signals, and the other is an FDA output signal with relative large noise and a larger amount of saturating signals. These signals are input to the composing circuit 70, and a composing ratio signal is produced from the FWD output signal having low noise. In this case, suppose that if the FWD output signal is equivalent to a signal of one electron or less (zero) in terms of the amount of electrons the composing ratio is set as to make the FWD output signal 100%, that if the FWD output signal is a signal having an unsaturated level, for example, a signal having 1000 electrons or more, the composing ratio is set as to make the FDA output signal 100%, and that the composing ratio signal is formed from the FWD output signal in such a way that the composing ratio continuously changes between these values. Then, the relation between a signal and noise in this case is represented by the following formula:

$$S = (A + \Delta A)(1-a) + (B + \Delta B)a \quad (1)$$

where S is a composition signal, A is an FDA output signal, $\Delta A$ is the amount of noise of the FDA output signal, B is an FWD output signal, $\Delta B$ is the amount of noise of the FWD output signal, and a is a composing ratio signal.

Since the composing ratio signal a is obtained from the FWD output signal, it also has noise, and is acquired by the following formula (2) when the composing ratio is between 0 to 100%.

$$a = \alpha(B + \Delta B - C) \quad (2)$$

where C is an FWD signal output when a is set to 0, and is a normalizing constant for setting a at 1 with a level by which the FWD output is not saturated. Substituting the formula (2) into formula (1) yields a formula (3) below:

$$S = (A + \Delta A)\{1 - \alpha(B + \Delta B - C)\} + (B + \Delta B)\alpha(B + \Delta B - C) \qquad (3)$$
$$= A + \Delta A + \alpha(B + \Delta B - C)(\Delta B - \Delta A - A - B)$$

Considering that the gain can be adjusted so as to set $A = B$ due to the composition signal being in proportion to the charges and that light which is to be the product of noises is too small to be neglected, the formula (3) can be rewritten as follows:

$$S \approx B + (1 - a')A + a'\Delta B \qquad (4)$$

The above is derived on the assumption that $a' = \alpha(B - C)$, i.e., the composition signal is free of noise. In other words, as there is no correlation between $\Delta A$ and $\Delta B$, a noise component N is given by the following formula (5):

$$N = \sqrt{(1 - a')^2 \Delta A^2 + a'^2 \Delta B^2} \qquad (5)$$

The formula (5) can be illustrated by the graph shown in FIG. 4. It is understood from the figure that, for any composing ratio (a), the noise component (curve C1) is smaller than the shot noise of a square root of the composition signal, i.e., the noise component (C2) present in a light signal coming from a pixel.

As described above, it is possible to realize a signal detecting method that can detect a signal linearly over nearly the entire area until the FDA output signal is saturated while reducing shot noise over the entire signal area where the noise region of the FWD output signal is large. In consideration of the sensitivity becoming higher as a signal becomes smaller, realizing this method means producing substantially the same effect as providing a detector whose visual noise characteristic is equal to the noise of the FWD signals over the entire area (refer to Television Society Technical Report ED-898, Nov. 14, 1985).

As mentioned above, this embodiment employs an FWD type detection circuit with low noise but a smaller amount of saturating signals and an FDA type detection circuit with slightly large noise but a larger amount of saturating signals and composes signals from these two circuits, whereby the ratio of the output signal of the first detection circuit in the composition signal is increased when an image signal in the image sensing channel is small and the ratio of the output signal of the second detection circuit in the composition signal is increased when the image signal is large. This can provide a signal detection circuit having low noise and a large amount of saturation signals, thus ensuring high sensitivity and low noise of a solid state image sensor. In this respect, the embodiment is significantly effective.

Referring now to FIG. 5, another embodiment will be described.

This embodiment has a low-sensitive floating gate amplifier 80 provided on the side of a horizontal register 40 (FIG. 1) and a high-sensitive floating diffusion amplifier 81 provided adjacent to the former amplifier 80. The amplifier 80 has a transistor whose gate 82 is connected to an input terminal of a transistor amplifier 83. The amplifier 83 has its output terminal connected via a buffer amplifier 84 to one input terminal of a composing circuit 85. The amplifier 81 has its source connected via a transistor amplifier 86 to a correlation double sampling circuit 87. This circuit 87 has its output terminal connected via a buffer amplifier 88 to another input terminal of the composing circuit 85. Buffer amplifier 88 generates a composing ratio signal.

The composing circuit 85 includes a subtracter 89, a multiplier 90 and an adder 91. The subtracter 89 subtracts the output signal of the buffer amplifier 84 from the output of the sampling circuit 87. The multiplier 90 multiplies the output signal of the buffer amplifier 88 by the output signal of the subtracter 89. The adder 91 adds the output signals of the multiplier 90 and buffer amplifier 84 together and outputs a composition signal.

As shown in FIG. 5, the floating gate amplifier which amplifies signal charges from a horizontal register 30 is used as the pre-stage signal detection circuit, while the correlation double sampling circuit preferably of low noise is used as the rear-stage signal detection circuit, thus realizing a signal detection circuit with low noise and a large amount of saturation signals. In this embodiment, an integral type correlation double sampling circuit or the like may replace the above-described correlation double sampling circuit.

As described above, according to the present invention, a signal detection circuit which may have a small amount of saturation signals but should have low noise is used as the first signal detection circuit, and a signal detection circuit which may have large noise but should have a large amount of saturation signals is used as the second signal detection circuit, thus providing a signal detection circuit with low noise and a large amount of saturation signals. The composing circuit need not be restricted to have the structure as shown in FIG. 1, but may be any circuit which can compose the outputs of the first and second signal detection circuits to provide a composed output and can change the composing ratio in accordance with the output of the first signal detection circuit (increasing the ratio of the output of the second signal detection circuit in the composed output as the output of the first signal detection circuit becomes large).

Again, as described above, the present invention employs two signal detection circuits with different noise and saturation signal characteristics and alters the composing ratio of the outputs of these two detection circuits in accordance with the amount of detected signals in a solid state image sensing channel, thereby ensuring signal charge detection having merits of both circuits. Accordingly, the amount of saturation signals can be made sufficiently high and the signal charges can be detected with low nose, thus making it possible to realize a solid state image sensor with a high sensitivity and low noise.

The present invention can be applied not only to solid state image sensors, but also to signal converters. By using A/D converters having different gains from each other in place of the first and second signal detection circuits before-mentioned, the definition of the "noise" used in this specification can be expanded to quantization noise such as heat noise.

Similarly, the present invention can be applied to D/A converter, current/voltage converter, or voltage/current converter.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A solid state image sensor comprising:
   image sensing means for outputting a light image as signal charges;
   first signal detecting means, connected to said image sensing means and having a characteristic of a low amount of saturation signals and low noise, for detecting said signal charges output from said image sensing means and for outputting a first detection signal having a low level signal component and a low level noise component;
   second signal detecting means, connected to said image sensing means and having a characteristic of a high amount of saturation signals and high noise, for detecting the same signal charges as outputted to said first signal detecting means from said image sensing means and for outputting a second detection signal having a high level signal component and a high level noise component; and
   adding means, connected to said first and second signal detecting means, for adding said first and second detection signals to obtain an output signal having a high level signal component and a low level signal component.

2. A solid state image sensor according to claim 1, wherein said first signal detecting means comprises a floating well type amplifier, and said second signal detecting means comprises a floating diffusion type amplifier, preceding said floating diffusion type amplifier, for detecting said signal charges transferred from said image sensing means.

3. A solid state image sensor according to claim 2, wherein said floating well type amplifier preceding said floating diffusion type amplifier comprises a first transistor having a channel to pass said signal charges, a source and a drain, and a source follower amplifier connected to said source of said first transistor.

4. A solid state image sensor according to claim 3, wherein said floating diffusion type amplifier comprises a second transistor formed adjacent to said first transistor of said floating well type amplifier and having a source and a drain, and a source follower amplifier connected to said source of said second transistor.

5. A solid state image sensor comprising:
   image sensing means for outputting a light image as signal charges;
   first signal detecting means, connected to said image sensing means and having a characteristic of a low amount of saturation signals and low noise, for detecting said signal charges output form said image sensing means and for outputting a first detection signal having a low level signal component and a low level noise component;
   second signal detecting means, connected to said image sensing means and having a characteristic of a high amount of saturation signals and high noise, for detecting the same signal charges as output to said first signal detecting means from said image sensing means and for outputting a second detection signal having a high level signal component and a high level noise component; and
   composing means including subtracting means for computing a difference between said first detection signal from said first signal detecting means and said second detection signal from said second signal detecting means, multiplying means for multiplying said second detection signal from said second signal detecting means by said difference and outputting a multiplication signal, and adding means for adding said multiplication signal to said second detection signal from said second signal detecting means and outputting a composition signal.

6. A solid state image sensor according to claim 1, wherein said first signal detecting means comprises a low-sensitivity floating gate amplifier for amplifying said signal charges and a source follower amplifier connected to said low-sensitivity floating gate amplifier, and said second signal detecting means is connected to said low-sensitivity floating gate amplifier and comprises a high-sensitivity floating diffusion amplifier for amplifying an output of said low-sensitivity floating gate amplifier and a correlation double sampling circuit connected to an output terminal of said floating diffusion amplifier.

7. A solid state image sensor comprising:
   a CCD type image sensing device for outputting a light image as a signal charge;
   a first signal detection circuit connected to said image sensing device and having a small amount of saturation signals and low noise;
   a second signal detection circuit connected to said image sensing device and having a large amount of saturation signals and large noise; and
   a composing circuit for composing outputs of said first and second signal detection circuits to provide a composed output and changing a composing ratio in accordance with said output of said first signal detection circuit.

8. A solid state image sensor according to claim 7, wherein said composing circuit increases a ratio of said output of said first signal detection circuit in said composed output when said output of said first signal detection circuit is small, and increases a ratio of said output of said second signal detection circuit in said composed output when said output of said first signal detection circuit is large.

9. A solid state image sensor according to claim 7, wherein said first signal detection circuit is a floating well type detector and said second signal detection circuit is a floating diffusion type detector.

* * * * *

UNITED STATES PATENT AND TRADEMARK OFFICE
CERTIFICATE OF CORRECTION

PATENT NO. : 5,060,070

DATED : October 22, 1991

INVENTOR(S) : Yasuaki Nishida, et al

It is certified that error appears in the above-identified patent and that said Letters Patent is hereby corrected as shown below:

The title page should be deleted to appear as per attached title page.

Fig 5 of the drawings should be added as shown on the attached sheet.

Signed and Sealed this

Ninth Day of March, 1993

Attest:

STEPHEN G. KUNIN

*Attesting Officer*   *Acting Commissioner of Patents and Trademarks*

United States Patent [19]
Nishida et al.

[11] Patent Number: 5,060,070
[45] Date of Patent: Oct. 22, 1991

[54] SOLID STATE IMAGE SENSOR HAVING LOW AND HIGH LEVEL SIGNAL COMPONENT DETECTORS

[75] Inventors: Yasuaki Nishida, Tokyo; Yoshiyuki Matsunaga, Kamakura; Nozomu Harada, Yokohama; Sohei Manabe, Yokohama; Yukio Endo, Yokohama, all of Japan

[73] Assignees: Nippon Hoso Kyokai, Tokyo; Kabushiki Kaisha Toshiba, Kawasaki, both of Japan

[21] Appl. No.: 527,444

[22] Filed: May 23, 1990

[30] Foreign Application Priority Data

May 25, 1989 [JP] Japan .................. 1-131869

[51] Int. Cl.$^5$ .................. H04N 3/14
[52] U.S. Cl. .................. 358/213.1 S; 358/213.16
[58] Field of Search .................. 358/213.1 S, 213.18, 358/213.16, 213.19, 909

[56] References Cited

U.S. PATENT DOCUMENTS

| | | | |
|---|---|---|---|
| 4,495,523 | 1/1985 | Ozawa | 358/213.1 S |
| 4,574,309 | 3/1986 | Arisawa et al. | 358/213.19 |
| 4,589,024 | 5/1986 | Koch | 358/213.19 |
| 4,839,729 | 6/1989 | Ando et al. | 358/213.16 |
| 4,902,886 | 2/1990 | Smisko | 358/213.1 S |
| 4,974,093 | 11/1990 | Murayama et al. | 358/213.1 S |

OTHER PUBLICATIONS

"A High Sensitivity Output Amplifier for CCD Image Sensor" Y. Matsunaga et al., pp. 116–119.

*Primary Examiner*—Stephen Brinich
*Attorney, Agent, or Firm*—Oblon, Spivak, McClelland, Maier & Neustadt

[57] ABSTRACT

A solid state image sensor comprises a CCD type image sensing device and a signal detector. This signal detector comprises an FDA type signal detection circuit connected to a signal pick-up terminal of the image sensing device and having a small amount of saturating signals and low noise, an FDA type signal detection circuit connected to the signal pick-up terminal and having a large amount of saturating signals and high noise, and a signal composing circuit for composing the outputs of both signal detection circuits and outputting a composed output and changing a composing ratio in accordance with the output of the FDA type signal detection circuit.

9 Claims, 4 Drawing Sheets

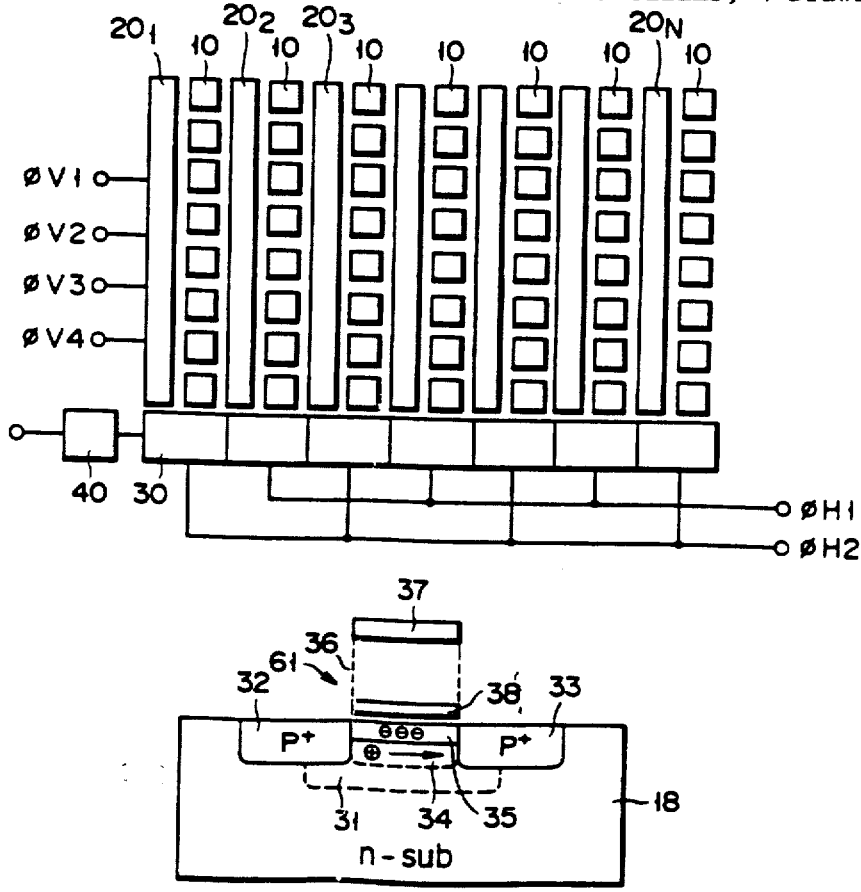

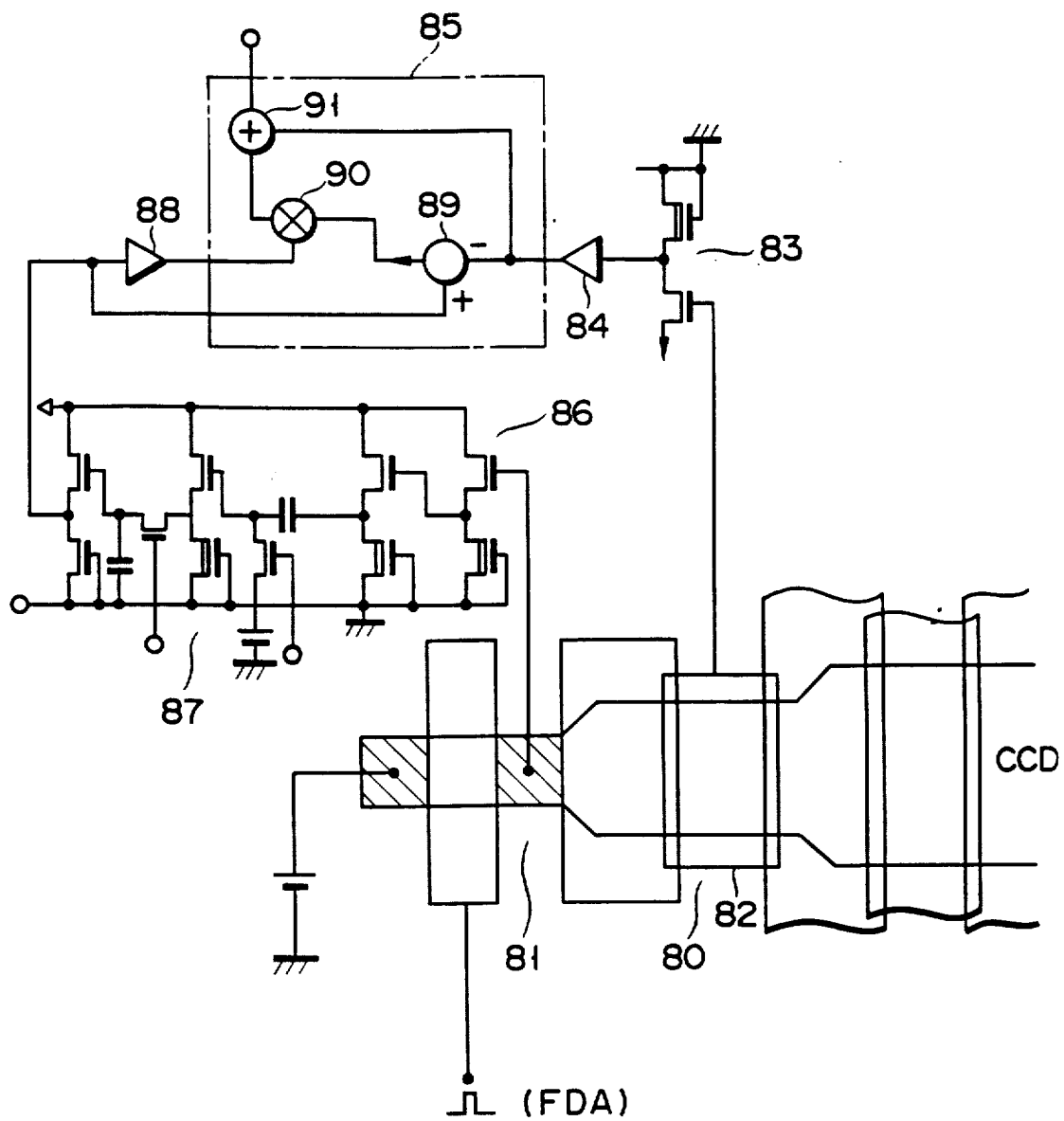
F I G. 5